(12) United States Patent
Lo et al.

(10) Patent No.: US 12,305,306 B2
(45) Date of Patent: May 20, 2025

(54) COATED ROUND WIRE

(71) Applicant: Heraeus Materials Singapore Pte. Ltd., Singapore (SG)

(72) Inventors: Miew Wan Lo, Singapore (SG); Murali Sarangapani, Singapore (SG); Yong Sheng Wang, Singapore (SG)

(73) Assignee: Heraeus Materials Singapore Pte. Ltd., Singapore (SG)

( * ) Notice: Subject to any disclaimer, the term of this patent is extended or adjusted under 35 U.S.C. 154(b) by 48 days.

(21) Appl. No.: 18/558,294

(22) PCT Filed: May 4, 2022

(86) PCT No.: PCT/SG2022/050275
§ 371 (c)(1),
(2) Date: Oct. 31, 2023

(87) PCT Pub. No.: WO2022/235219
PCT Pub. Date: Nov. 10, 2022

(65) Prior Publication Data
US 2024/0368794 A1    Nov. 7, 2024

(30) Foreign Application Priority Data

May 5, 2021   (SG) .......................... 10202104654V

(51) Int. Cl.
*C25D 5/12*   (2006.01)
*B21C 1/02*   (2006.01)
*C25D 5/50*   (2006.01)
*C25D 7/06*   (2006.01)

(52) U.S. Cl.
CPC .................. *C25D 5/12* (2013.01); *B21C 1/02* (2013.01); *C25D 5/50* (2013.01); *C25D 7/0607* (2013.01)

(58) Field of Classification Search
None
See application file for complete search history.

(56) References Cited

U.S. PATENT DOCUMENTS

2018/0345421 A1   12/2018   Kang et al.

FOREIGN PATENT DOCUMENTS

| TW | 202025321 A | 7/2020 | |
|---|---|---|---|
| WO | 2016093769 A1 | 6/2016 | |
| WO | 2017/091144 A1 | 6/2017 | |
| WO | 2018/074857 A1 | 4/2018 | |
| WO | WO-2020218968 A1 * | 10/2020 | ......... B23K 35/3006 |
| WO | 2022/081080 A1 | 4/2022 | |

* cited by examiner

*Primary Examiner* — Elizabeth Collister
(74) *Attorney, Agent, or Firm* — Blank Rome LLP

(57) ABSTRACT

A round wire comprising a wire core with a surface, the wire core having a coating layer superimposed on its surface, wherein the wire core itself is a silver-based wire core, wherein the coating layer is a double-layer comprised of a 1 to 100 nm thick inner layer of palladium or nickel and an adjacent 1 to 250 nm thick outer layer of gold, wherein the outer layer of gold exhibits at least one of the following intrinsic properties A1) and A2): A1) the average grain size of the crystal grains in the outer layer of gold, measured in longitudinal direction, is in the range of from-0.1 to 0.8 μm; A2) 60 to 100% of the crystal grains in the outer layer of gold are oriented in <100>direction, and 0 to 20% of the crystal grains in the outer layer of gold are oriented in <111>direction.

15 Claims, No Drawings

COATED ROUND WIRE

The invention relates to a coated round wire comprising a silver-based wire core and a coating layer superimposed on the surface of the wire core. The invention further relates to a process for manufacturing such coated round wire.

The use of bonding wires in electronics and microelectronics applications is well-known state of the art. While bonding wires were made from gold in the beginning, nowadays less expensive materials are used such as copper, copper alloys, silver and silver alloys. Such wires may have a metal coating.

With respect to wire geometry, most common are bonding wires of circular cross-section and bonding ribbons which have a more or less rectangular cross-section. Both types of wire geometries have their advantages making them useful for specific applications.

It is an object of the invention to provide a coated round silver-based wire suitable for use in wire bonding applications, the wire apart from satisfying fundamental requirements like wire softness, feasibility of FAB (free air ball) formation under air atmosphere and corrosion as well oxidation resistance, also being outstanding in particular in prevention of flowery bonded ball as well as in stable looping behaviour with regard to wire sway.

A contribution to the solution of said object is provided by the subject-matter of the category-forming claims. The dependent sub-claims of the category-forming claims represent preferred embodiments of the invention, the subject-matter of which also makes a contribution to solving the objects mentioned above.

The invention relates to a round wire comprising a wire core (hereinafter also called "core" for short) with a surface, the wire core having a coating layer superimposed on its surface, wherein the wire core itself is a silver-based wire core, wherein the coating layer is a double-layer comprised of a 1 to 100 nm thick inner layer of palladium or nickel and an adjacent 1 to 250 nm thick outer layer of gold, wherein the outer layer of gold exhibits at least one of the following intrinsic properties A1) and A2) (see "Test method A" as described below):

A1) the average grain size of the crystal grains in the outer layer of gold, measured in longitudinal direction, is in the range of from 0.1 to 0.8 µm, preferably 0.1 to 0.4 µm, most preferred 0.15 to 0.25 µm;

A2) 60 to 100%, preferably 80 to 100% of the crystal grains in the outer layer of gold are oriented in <100> direction, and 0 to 20%, preferably 0 to 10% of the crystal grains in the outer layer of gold are oriented in <111> direction, each % with respect to the total number of crystal grains with orientation parallel to the drawing direction of the wire.

The term "intrinsic property" is used herein. Intrinsic property means a property which an object has of itself (independently of other factors), while an extrinsic property depends on the object's relationship or interaction with other external factors.

The wire of the invention is preferably a bonding wire for bonding in microelectronics. It is preferably a one-piece object. For the invention, the term "bonding wire" comprises bonding wires with circular cross-section and thin diameters. The average diameter is in the range of, for example, from 8 to 80 µm or preferably 12 to 55 µm.

The average diameter or, simply stated, the diameter of a wire or wire core can be obtained by the "sizing method". According to this method the physical weight of the wire for a defined length is determined. Based on this weight, the diameter of a wire or wire core is calculated using the density of the wire material. The diameter is calculated as arithmetic mean of five measurements on five cuts of a particular wire.

The wire core is a silver-based wire core; i.e. the wire core consists of a silver-based material in the form of (a) doped silver, (b) a silver alloy or (c) a doped silver alloy.

The term "doped silver" used herein means a silver-based material consisting of (a1) silver in an amount in the range of from >99.49 to 99.997 wt.-%, (a2) at least one doping element other than silver in a total amount of from 30 to <5000 wt.-ppm and (a3) further components (components other than silver and the at least one doping element) in a total amount of from 0 to 100 wt.-ppm. In a preferred embodiment, the term "doped silver" used herein means doped silver consisting of (a1) silver in an amount in the range of from >99.49 to 99.997 wt.-%, (a2) at least one doping element selected from the group consisting of calcium, nickel, platinum, palladium, gold, copper, rhodium and ruthenium in a total amount of from 30 to <5000 wt.-ppm and (a3) further components (components other than silver, calcium, nickel, platinum, palladium, gold, copper, rhodium and ruthenium) in a total amount of from 0 to 100 wt.-ppm.

The term "silver alloy" used herein means a silver-based material consisting of (b1) silver in an amount in the range of from 89.99 to 99.5 wt.-%, preferably 97.99 to 99.5 wt.-%, (b2) at least one alloying element in a total amount in the range of from 0.5 to 10 wt.-%, preferably 0.5 to 2 wt.-% and (b3) further components (components other than silver and the at least one alloying element) in a total amount of from 0 to 100 wt.-ppm. In a preferred embodiment, the term "silver alloy" used herein means a silver alloy consisting of (b1) silver in an amount in the range of from 89.99 to 99.5 wt.-%, preferably 97.99 to 99.5 wt.-%, (b2) at least one alloying element selected from the group consisting of nickel, platinum, palladium, gold, copper, rhodium and ruthenium in a total amount in the range of from 0.5 to 10 wt.-%, preferably 0.5 to 2 wt.-% and (b3) further components (components other than silver, nickel, platinum, palladium, gold, copper, rhodium and ruthenium) in a total amount of from 0 to 100 wt.-ppm. Silver alloys comprising palladium as the only alloying element are most preferred, in particular those having a palladium content of 1 to 2 wt.-%, especially 1.5 wt.-%.

The term "doped silver alloy" used herein means a silver-based material consisting of (c1) silver in an amount in the range of from >89.49 to 99.497 wt.-%, preferably 97.49 to 99.497 wt.-%, (c2) at least one doping element in a total amount of from 30 to <5000 wt.-ppm, (c3) at least one alloying element in a total amount in the range of from 0.5 to 10 wt.-%, preferably 0.5 to 2 wt.-% and (c4) further components (components other than silver, the at least one doping element and the at least one alloying element) in a total amount of from 0 to 100 wt.-ppm, wherein the at least one doping element (c2) is other than the at least one alloying element (c3). In a preferred embodiment, the term "doped silver alloy" used herein means a doped silver alloy consisting of (c1) silver in an amount in the range of from >89.49 to 99.497 wt.-%, preferably 97.49 to 99.497 wt.-%, (c2) at least one doping element selected from the group consisting of calcium, nickel, platinum, palladium, gold, copper, rhodium and ruthenium in a total amount of from 30 to <5000 wt.-ppm, (c3) at least one alloying element selected from the group consisting of nickel, platinum, palladium, gold, copper, rhodium and ruthenium in a total amount in the range of from 0.5 to 10 wt.-%, preferably 0.5 to 2 wt.-% and (c4) further components (components other than silver, calcium, nickel, platinum, palladium, gold, copper, rhodium and ruthenium) in a total amount of from 0 to 100 wt.-ppm, wherein the at least one doping element (c2) is other than the at least one alloying element (c3).

This disclosure mentions "further components" and "doping elements". The individual amount of any further component is less than 30 wt.-ppm. The individual amount of any doping element is at least 30 wt.-ppm. All amounts in wt.-% and wt.-ppm are based on the total weight of the core or its precursor item or elongated precursor item.

The core of the wire of the invention may comprise so-called further components in a total amount in the range of from 0 to 100 wt.-ppm, for example, 10 to 100 wt.-ppm. In the present context, the further components, often also referred as "inevitable impurities", are minor amounts of chemical elements and/or compounds which originate from impurities present in the raw materials used or from the wire core manufacturing process. The low total amount of 0 to 100 wt.-ppm of the further components ensures a good reproducibility of the wire properties. Further components present in the core are usually not added separately. Each individual further component is comprised in an amount of less than 30 wt.-ppm, based on the total weight of the wire core.

The core of the wire is a homogeneous region of bulk material. Since any bulk material always has a surface region which might exhibit different properties to some extent, the properties of the core of the wire are understood as properties of the homogeneous region of bulk material. The surface of the bulk material region can differ in terms of morphology, composition (e.g. sulfur, chlorine and/or oxygen content) and other features. The surface is an interface region between the wire core and the coating layer superimposed on the wire core. Typically, the coating layer is completely superimposed on the wire core's surface. In the region of the wire between its core and the coating layer superimposed thereon a combination of materials of both, the core and the coating layer, can be present.

The coating layer superimposed on the surface of the wire core is a double-layer comprised of a 1 to 100 nm thick, preferably 1 to 30 nm thick inner layer of palladium or nickel and an adjacent 1 to 250 nm thick, preferably 20 to 200 nm thick outer layer of gold. In this context the term "thick" or "coating layer thickness" means the size of the coating layer in perpendicular direction to the longitudinal axis of the core.

The coated round wire of the invention, or its outer layer of gold respectively, exhibits at least one of the following intrinsic properties A1) and A2):

A1) the average grain size of the crystal grains in the outer layer of gold, measured in longitudinal direction, is in the range of from 0.1 to 0.8 μm, preferably 0.1 to 0.4 μm, most preferred 0.15 to 0.25 μm;

A2) 60 to 100%, preferably 80 to 100% of the crystal grains in the outer layer of gold are oriented in <100> direction, and 0 to 20%, preferably 0 to 10% of the crystal grains in the outer layer of gold are oriented in <111> direction, each % with respect to the total number of crystal grains with orientation parallel to the drawing direction of the wire.

It is preferred that the coated round wire of the invention exhibits both, the intrinsic properties A1) and A2).

In a preferred embodiment, the coated round wire of the invention exhibits also at least one of the following intrinsic properties A3) to A5) (see "Test methods B and C" as described below):

A3) the average grain size of the crystal grains in the wire core, measured in longitudinal direction, is in the range of from 0.7 to 1.1 μm;

A4) the fraction of twin boundaries, measured in longitudinal direction of the wire core, is in the range of from 5 to 40%;

A5) 20 to 70% of the crystal grains of the wire core are oriented in <100> direction, and 3 to 40% of the crystal grains of the wire core are oriented in <111> direction, each % with respect to the total number of crystal grains with orientation parallel to the drawing direction of the wire.

It is preferred that the coated round wire of the preferred embodiment exhibits at least two of the intrinsic properties A3) to A5). It is more preferred that the wire of the preferred embodiment exhibits all of the intrinsic properties A3) to A5).

In an advantageous embodiment, the gold layer comprises at least one member selected from the group consisting of antimony, bismuth, arsenic and tellurium in a total proportion in the range of from 10 to 300 wt.-ppm, preferably 10 to 150 wt.-ppm, based on the weight of the wire of the invention. At the same time, in an embodiment, the total proportion of the at least one member selected from the group consisting of antimony, bismuth, arsenic and tellurium may be in the range of from 300 to 9500 wt.-ppm, preferably 300 to 5000 wt.-ppm, most preferably 600 to 3000 wt.-ppm, based on the weight of the gold of the gold layer.

Within the advantageous embodiment, it is preferred that antimony is present within the gold layer and it is even more preferred that antimony is alone present within the gold layer, i.e. without the simultaneous presence of bismuth, arsenic and tellurium. In other words, in a most preferred variant of the advantageous embodiment, the gold layer comprises antimony in a proportion in the range of from 10 to 300 wt.-ppm, preferably 10 to 150 wt.-ppm, based on the weight of the wire (wire core plus coating layer), without bismuth, arsenic and tellurium being present within the gold layer; at the same time, in an embodiment, the proportion of the antimony may be in the range of from 300 to 9500 wt.-ppm, preferably 300 to 5000 wt.-ppm, most preferably 600 to 3000 wt.-ppm, based on the weight of the gold of the gold layer.

Within the advantageous embodiment, the at least one member selected from the group consisting of antimony, bismuth, arsenic and tellurium may exhibit a concentration gradient within the gold layer, said gradient increasing in the direction towards the wire core, i.e. in perpendicular direction to the longitudinal axis of the wire core.

In another aspect, the invention relates also to a process for the manufacture of the coated round wire of the invention in any of its embodiments disclosed above. The process comprises at least the steps (1) to (5):

(1) providing a silver-based precursor item, (2) elongating the precursor item to form an elongated precursor item, until an intermediate diameter in the range of from 30 to 200 μm is obtained, (3) applying a double-layer coating of an inner layer of palladium or nickel and an adjacent outer layer of gold on the surface of the elongated precursor item obtained after completion of process step (2), (4) further elongating the coated precursor item obtained after completion of process step (3) until a desired final diameter and a double-layer comprised of an inner layer of palladium or nickel having a desired final thickness in the range of from 1 to 100 nm and an adjacent outer layer of gold having a desired final thickness in the range of from 1 to 250 nm is obtained, and (5) finally strand annealing the coated precursor obtained after completion of process step (4) at an oven set temperature in the range of from >370 to 520° C., preferably of from >400 to 460° C., for an exposure time in the range of from 0.8 to 10 seconds, preferably 0.8 to 2 seconds, to form the coated round wire, wherein step (2) may include one or more sub-steps of intermediate batch annealing of the precursor item at an oven set temperature of from 200 to 650° C. for an exposure time in the range of from 30 to 300 minutes, preferably at an oven set temperature of from 300 to 500° C. for an exposure time in the range of from 60 to 180 minutes, and wherein the further elongating of step (4) comprises die drawing with the following drawing parameters B1) to B4) prevailing:

B1) the drawing speed is within the range of 500 to 700 meters per minute,

B2) the cone angle of each drawing die is within the range of 70 to 90 degrees,

B3) the bearing length at each drawing die is 30 to 40% of the diameter of the respective circular drawing die opening, B4) the circular cross-sectional area reduction of the coated precursor item at each drawing die is in the range of 7 to 15%.

The term "strand annealing" is used herein. It is a continuous process allowing for a fast production of a wire with high reproducibility. In the context of the invention, strand annealing means that the annealing is done dynamically while the coated precursor to be annealed is pulled or moved through a conventional annealing oven and spooled onto a reel after having left the annealing oven. Here, the annealing oven is typically in the form of a cylindrical tube of a given length. With its defined temperature profile at a given annealing speed which may be chosen in the range of, for example, from 10 to 60 meters/minute the annealing time/oven temperature parameters can be defined and set.

The term "oven set temperature" is used herein. It means the temperature fixed in the temperature controller of the annealing oven. The annealing oven may be a chamber furnace type oven (in case of batch annealing) or a tubular annealing oven (in case of strand annealing).

This disclosure distinguishes between precursor item, elongated precursor item, coated precursor item, coated precursor and coated round wire. The term "precursor item" is used for those round wire pre-stages which have not reached the desired final diameter of the wire core, while the term "precursor" is used for a wire pre-stage at the desired final diameter. After completion of process step (5), i.e. after the final strand annealing of the coated precursor at the desired final diameter a coated round wire in the sense of the invention is obtained.

The precursor item as provided in process step (1) is a silver-based precursor item; i.e. the precursor item consists of (a) doped silver, (b) a silver alloy or (c) a doped silver alloy. As regards the meaning of the terms "doped silver", "silver alloy" and "doped silver alloy" reference is made to the afore made disclosure.

In the embodiment of a silver-based precursor item the latter can be obtained by alloying, doping or alloying and doping silver with the desired amount of the required components. The doped silver or silver alloy or doped silver alloy can be prepared by conventional processes known to the person skilled in the art of metal alloys, for example, by melting together the components in the desired proportional ratio. In doing so, it is possible to make use of one or more conventional master alloys. The melting process can for example be performed making use of an induction furnace and it is expedient to work under vacuum or under an inert gas atmosphere. The materials used can have a purity grade of, for example, 99.99 wt.-% and above. The melt so-produced can be cooled to form a homogeneous piece of silver-based precursor item. Typically, such precursor item is in the form of a round rod having a diameter of, for example, 2 to 25 mm and a length of, for example, 2 to 100 m. Such rod can be made by continuous casting the silver-based melt using an appropriate mold, followed by cooling and solidifying.

In process step (2) the silver-based precursor item is elongated to form an elongated precursor item, until an intermediate diameter in the range of from 30 to 200 μm is obtained. Techniques to elongate a precursor item are known and appear useful in the context of the invention. Preferred techniques are rolling, swaging, die drawing or the like, of which die drawing is particularly preferred. In the latter case the precursor item is drawn in several process steps until the desired intermediate cross-section or the desired intermediate diameter is reached. Such wire die drawing process is well known to the person skilled in the art. Conventional tungsten carbide and diamond drawing dies may be employed and conventional drawing lubricants may be employed to support the drawing.

Step (2) of the process of the invention may include one or more sub-steps of intermediate batch annealing of the elongated precursor item at an oven set temperature in the range of from 200 to 650° C. for an exposure time in the range of from 30 to 300 minutes, preferably at an oven set temperature of from 300 to 500° C. for an exposure time in the range of from 60 to 180 minutes. Said optional intermediate batch annealing may be performed, for example, with a rod drawn to a diameter of 2 mm and coiled on a drum.

The optional intermediate batch annealing of process step (2) may be performed under an inert or reducing atmosphere. Numerous types of inert atmospheres as well as reducing atmospheres are known in the art and are used for purging the annealing oven. Of the known inert atmospheres, nitrogen or argon is preferred. Of the known reducing atmospheres, hydrogen is preferred. Another preferred reducing atmosphere is a mixture of hydrogen and nitrogen. Preferred mixtures of hydrogen and nitrogen are 90 to 98 vol.-% nitrogen and, accordingly, 2 to 10 vol.-% hydrogen, wherein the vol.-% total 100 vol.-%. Preferred mixtures of nitrogen/hydrogen are equal to 93/7, 95/5 and 97/3 vol.-%/vol.-%, each based on the total volume of the mixture.

In process step (3) a coating in the form of a double-layer coating of an inner layer of palladium or nickel and an adjacent outer layer of gold is applied on the surface of the elongated precursor item obtained after completion of process step (2) so as to superimpose the coating over said surface.

The skilled person knows how to calculate the thickness of such coating on an elongated precursor item to finally obtain the coating in the layer thickness disclosed for the embodiments of the wire, i.e. after finally elongating the coated precursor item. The skilled person knows numerous techniques for forming a coating layer of a material according to the embodiments on a silver-based surface. Preferred techniques are plating, such as electroplating and electroless plating, deposition of the material from the gas phase such as sputtering, ion plating, vacuum evaporation and physical vapor deposition, and deposition of the material from the melt. In case of applying said double-layer comprised of inner palladium or nickel layer and outer gold layer, it is preferred to apply the palladium or nickel layer by electroplating.

The gold layer is also preferably applied by electroplating. Gold electroplating is performed making use of a gold electroplating bath, i.e. an electroplating bath that allows for a palladium or a nickel cathode surface to be electroplated with gold. In other words, the gold electroplating bath is a composition allowing for direct application of gold in elemental, metallic form onto a palladium or a nickel surface wired as cathode.

Electroplating application of the gold layer is performed by guiding the palladium- or nickel-coated elongated precursor item wired as a cathode through the gold electroplating bath. The so obtained gold-coated precursor item exiting the gold electroplating bath may be rinsed and dried before process step (4) is performed. The use of water as a rinsing medium is expedient, with alcohol and alcohol/water mixtures being further examples of rinsing media. The gold electroplating of the palladium- or nickel-coated elongated precursor item passing through the gold electroplating bath can take place at a direct voltage in the range of, for example, 0.2 to 20 V at a current in the range of, for example, 0.001 to 5 A, in particular 0.001 to 1 A or 0.001 to 0.2 A. Typical contact times may be in the range of, for example, 0.1 to 30 seconds, preferably 2 to 8 seconds. The current densities used in this context can be in the range of, for example, 0.01 to 150 $A/dm^2$. The gold electroplating bath may have a temperature in the range of, for example, 45 to 75° C., preferably 55 to 65° C.

The thickness of the gold coating layer can be adjusted as desired essentially via the following parameters: chemical composition of the gold electroplating bath, contact time of the elongated precursor item with the gold electroplating bath, current density. In this context, the thickness of the gold layer can generally be increased by increasing the concentration of the gold in the gold electroplating bath, by increasing the contact time of the elongated precursor item wired as cathode and the gold electroplating bath, and by increasing the current density.

In an embodiment, the process of the invention is a process for the manufacture of the coated round wire of the invention in its afore disclosed advantageous embodiment. Here, the application of the gold layer in step (3) is performed by electroplating it from a gold electroplating bath comprising gold and at least one member selected from the group consisting of antimony, bismuth, arsenic and tellurium. Hence, in said embodiment, the gold electroplating bath is a composition allowing for the deposition of not only the elemental gold but also allowing for depositing said at least one member selected from the group consisting of antimony, bismuth, arsenic and tellurium within the gold layer. It is unknown what chemical species said at least one member is, i.e. whether it is present in the gold layer in elemental form or as a chemical compound. In said embodiment, the gold electroplating bath can be made by adding said at least one member in a suitable chemical form (e.g. compounds like $Sb_2O_3$, $BiPO_4$, $As_2O_3$ or $TeO_2$) to an aqueous composition containing gold as dissolved salt or dissolved salts. Examples of such aqueous compositions into which the at least one member can be added are Aurocor® K 24 HF made by Atotech and Auruna® 558 and Auruna® 559 made by Umicore. Alternatively, one can use a gold electroplating bath which already comprises at least one member selected from the group consisting of antimony, bismuth, arsenic and tellurium, like, for example, a gold electroplating bath based on MetGold Pure ATF made by Metalor. The concentration of the gold in the gold electroplating bath can be in the range of, for example, 8 to 40 g/l (grams per liter), preferably 10 to 20 g/l. The concentration of the at least one member selected from the group consisting of antimony, bismuth, arsenic and tellurium in the gold electroplating bath can be in the range of, for example, 15 to 50 wt.-ppm, preferably 15 to 35 wt.-ppm.

In process step (4) the coated round precursor item obtained after completion of process step (3) is further elongated until a desired final diameter of the wire having a double-layer comprised of an inner layer of palladium or nickel having a desired final thickness in the range of from 1 to 100 nm, preferably 1 to 30 nm, and an adjacent outer layer of gold having a desired final thickness in the range of from 1 to 250 nm, preferably 20 to 200 nm, is obtained. The elongation technique employed in step (4) comprises die drawing or it is die drawing. Conventional tungsten carbide and diamond drawing dies may be employed and conventional drawing lubricants may be employed to support the die drawing. However, it is essential that the following drawing parameters B1) to B4) prevail during the die drawing of process step (4):

B1) the drawing speed is within the range of 500 to 700 meters per minute,
B2) the cone angle of each drawing die is within the range of 70 to 90 degrees,
B3) the bearing length at each drawing die is 30 to 40% of the diameter of the respective circular drawing die opening,
B4) the circular cross-sectional area reduction of the coated precursor item at each drawing die is in the range of 7 to 15%.

Without being bound to a theory, it is believed, that the interaction of all drawing parameters B1) to B4) together is one key—if not even the decisive key—to obtain the beneficial properties of the coated round wire of the invention.

The skilled person knows that the die drawing in the course of step (4) means pulling the coated precursor item through one or more drawing die sets, for example, one, two or three drawing die sets. A drawing die set comprises a number of consecutively arranged drawing dies, for example, 9 to 22 consecutively arranged drawing dies. In other words, the die drawing in the course of step (4) means pulling the coated precursor item through the consecutively arranged drawing dies each of which having a conical entrance, wherein the drawing dies' circular openings become narrower in the drawing direction, and wherein the coated precursor item becomes thinner by passing the drawing dies' openings so as to leave the final drawing die at final wire diameter.

The drawing parameter B1) mentioned herein refers to a drawing speed within the range of 500 to 700 meters per minute. To prevent any misunderstandings, this drawing speed is the speed with which the coated precursor item leaves the final drawing die's circular opening, i.e. at final wire diameter prior to the final strand annealing of process step (5).

The drawing parameter B2) mentioned herein refers to the cone angle (entrance angle) of each drawing die to be within the range of 70 to 90 degrees.

The drawing parameter B3) mentioned herein refers to the bearing length at each drawing die to be 30 to 40% of the diameter of the respective circular drawing die opening.

Each drawing die's circular opening forms a cylindrical hollow space which is characterized by its diameter and by the length of the cylinder (=the bearing length).

The drawing parameter B4) mentioned herein refers to the circular cross-sectional area reduction of the coated precursor item at each drawing die to be in the range of 7 to 15%. In other words, drawing parameter B4) describes the stepwise narrowing which the coated precursor item experiences at each drawing die.

In process step (5) the coated precursor obtained after completion of process step (4) is finally strand annealed at an oven set temperature in the range of from >370 to 520° C. for an exposure time in the range of from 0.8 to 10 seconds, preferably 0.8 to 2 seconds to form the coated round wire of the invention. In a preferred embodiment, the oven set temperature range is even narrower, i.e. it ranges then from >400 to 460° C.

In a preferred embodiment, the finally strand annealed coated precursor, i.e. the still hot coated round wire is quenched in water which, in an embodiment, may contain one or more additives, for example, 0.01 to 0.2 volume-% of additive(s). The quenching in water means immediately or rapidly, i.e. within 0.2 to 0.6 seconds, cooling the finally strand annealed coated precursor from the temperature it experienced in process step (5) down to room temperature, for example by dipping or dripping.

After completion of process step (5) and the optional quenching the coated round wire of the invention is finished. In order to fully benefit from its properties, it is expedient to either use it immediately for wire bonding applications, i.e. without delay, for example, within no longer than 25 to 70, preferably 60 days after completion of process step (5). Alternatively, in order to keep the wire's wide wire bonding process window property and in order to prevent it from oxidative/sulfidation or other chemical attack, the finished wire is typically spooled and vacuum sealed immediately after completion of process step (5), i.e. without delay, for example, within <1 to 5 hours after completion of process step (5) and then stored for further use as bonding wire. Storage in vacuum sealed condition should not exceed 12 months. After opening the vacuum seal, the wire should be used for wire bonding within no longer than 25 to 70, preferably 60 days.

It is preferred that all process steps (1) to (5) as well as spooling and vacuum sealing are carried out under clean room conditions (US FED STD 209E cleanroom standards, 1 k standard).

A third aspect of the invention is a coated round wire obtainable by the afore disclosed process according to any embodiment thereof. It has been found that the coated round wire of the invention is well suited for use as a bonding wire in wire bonding applications. Wire bonding technique is well known to the skilled person. In the course of wire bonding it is typical that a ball bond ($1^{st}$ bond) and a stitch bond ($2^{nd}$ bond, wedge bond) are formed. During bond forming a certain force (typically measured in grams) is applied, supported by application of ultrasonic energy (typically measured in mA). The coated round wire of the invention exhibits a considerably wide wire bonding process window.

The following non-limiting examples illustrate the invention. These examples serve for exemplary elucidation of the invention and are not intended to limit the scope of the invention or the claims in any way.

TEST METHODS

All tests and measurements were conducted at T=20° C. and a relative humidity RH=50%.

A. Electron Backscattered Diffraction (EBSD) Pattern Analysis for Determination of the Crystallographic Orientation and Grain Size of the Crystal Grains of the Outer Gold Layer:

The wire was placed on a sample holder and fixed using conductive copper tape and observed in FESEM (field emission scanning electron microscope) with a 70° angled holder to the normal FESEM sample holding table surface. The FESEM was further equipped with an EBSD detector. The electron back-scattering patterns (EBSP) containing the wire surface crystallographic information of outer gold layer were obtained.

These patterns were further analyzed for crystal grain orientation fraction, average crystal grain size, etc. (using a software called EBSD program developed by Oxford Instruments). Points of similar orientation were grouped together to form the texture component.

The wires were first potted using cold-mounting epoxy resin and then polished (cross-sectioned) by standard metallographic technique. A multi-prep semi-automatic polisher was used with low force and optimal speed to grind and polish the sample with minimum deformation strain on the sample surface. Finally, the polished surface is ion-milled to remove a thin layer to further reduce the deformation strain to close to zero. The crystal grain size was measured using grain boundary delineation concept defining critical misorientation angle (>15°) with EBSD tool according to the ASTM E2627-13 (2019) standard. To accurately measure grain size, grain boundaries were first detected with highest degree of grain boundary delineation.

To distinguish different texture components, a maximum tolerance angle of 10° was used. The wire drawing direction was set as a reference orientation. The <100> and <111> texture percentages were calculated by measurement of the percentage of crystals with <100> and <111> plane of orientation parallel to the reference orientation.

The EBSD pattern analysis was performed at five different locations per sample to obtain average values.

B. Electron Backscattered Diffraction (EBSD) Pattern Analysis for Determination of the Crystallographic Orientation and Twin Boundaries of the Crystal Grains of the Wire Core:

The main steps adopted to measure wire texture were sample preparation, getting good Kikuchi pattern and component calculation:

The wires were first potted using epoxy resin and polished as per standard metallographic technique. Ion milling was applied in the final sample preparation step to remove any mechanical deformation of the wire surface, contamination and oxidation layer. The ion-milled cross-sectioned sample surface was sputtered with gold. Then ion milling and gold sputtering were carried out for two further rounds. No chemical etching or ion-etching was carried out.

The sample was loaded in a FESEM (field emission scanning electron microscope) with a 70° angled holder to the normal FESEM sample holding table surface. The FESEM was further equipped with an EBSD detector. The electron back-scattering patterns (EBSP) containing the wire crystallographic information were obtained.

These patterns were further analyzed for crystal grain orientation fraction, average crystal grain size, etc. (using a software called EBSD program developed by Oxford Instruments). Points of similar orientation were grouped together to form the texture component.

To distinguish different texture components, a maximum tolerance angle of 10° was used. The wire drawing direction was set as a reference orientation. The <100> and <111> texture percentages were calculated by measurement of the percentage of crystals with <100> and <111> plane of orientation parallel to the reference orientation.

Twin boundaries (also called 23 CSL twin boundaries) were excluded in the average crystal grain size calculation. The twin boundary was described by a 60° rotation about ≤111> plane of orientation between the neighboring crystallographic domains. The number of scanning points of the area of interest depends on the step size, which was less than ⅕ of the observed finest-crystal grain size (about 100 nm).

The EBSD pattern analysis was performed at five different locations per sample to obtain average values.

C. Linear Intercept Method for Determination of the Sizes of the Crystal Grains of the Wire Core:

The wires were first potted using cold-mounting epoxy resin and then polished (cross-sectioned) by standard metallographic technique. A multi-prep semi-automatic polisher was used with low force and optimal speed to grind and polish the sample with minimum deformation strain on the sample surface. Finally, the polished sample was chemically etched using ferric chloride to reveal the crystal grain boundary. The crystal grain size was measured using linear intercept method under optical microscopy with a magnification of 1000, according to the ASTM E112-12 Standard.

D. Evaluation of Flowery Bonded Ball and Wire Sway:

D.1) Preparation of FAB:

It was worked according to the procedures described in the KNS Process User Guide for FAB (Kulicke & Soffa Industries Inc, Fort Washington, PA, USA, 2002, 31 May 2009) in ambient atmosphere. FAB was prepared by performing conventional electric flame-off (EFO) firing by standard firing (single step, 20 μm wire, EFO current of 50 mA, EFO time 315 μs, BSR ratio 2.3 (Bonded Ball to wire diameter ratio, using IConn—KNS bonder).

D.2) Ball Bonding:

The formed FAB descended to an Al-0.5 wt.-% Cu bond pad from a predefined height (tip of 203.2 μm) and speed (contact velocity of 6.4 μm/sec). Upon touching the bond pad, a set of defined bonding parameters (bond force of 100 g, ultrasonic energy of 95 mA and bond time of 15 ms) took into effect to deform the FAB and formed the bonded ball. After forming the ball, the capillary rose to a predefined height (kink height of 152.4 μm and loop height of 254 μm) to form the loop. After forming the loop, the capillary descended to the lead to form the stitch. After forming the stitch, the capillary rose and the wire clamp closed to cut the wire to make the predefined tail length (tail length extension of 254 μm). For each sample a meaningful number of 2500 bonded wires were optically inspected using a microscope with a magnification of 1000. The percentage of defects was determined.

D.3) Evaluation of Bonded Ball with Respect to Flowery Bonded Ball:

+ Poor: ≥15% of the bonded balls are not round but deformed

++ Good: ≥10% to <15% of the bonded balls are not round but deformed

+++ Very good: <10% of the bonded balls are not round but deformed

D.4) Evaluation of Wire Sway:

+ Poor: <25% of the wires deflect towards neighbor wire in the loop

++ Good: <5% of the wires deflect towards neighbor wire in the loop

+++ Excellent: wires show no loop deflections

Wire Examples

For all wire examples a quantity of 98.5 wt % silver (Ag) and 1.5 wt % palladium (Pd) of at least 99.99% purity ("4N") for each metal were melted in a crucible. Then wire core precursor items in the form of 8 mm rods were continuously cast from the melt. The rods were then drawn in several drawing steps to form wire core precursors having circular cross-sections with diameters of 2 mm. The wire core precursors were intermediate batch annealed at an oven set temperature of 500° C. for an exposure time of 60 minutes. The rods were further drawn in several drawing steps to form wire core precursors having diameters of 46 μm.

All wire core precursors were electroplated with a double-layer coating of an inner layer of nickel and an adjacent outer layer of gold. To this end, the wire core precursor while being wired as cathode was moved through a 60° C. warm nickel electroplating bath and, subsequently, through a 61° C. warm gold electroplating bath. The nickel electroplating bath comprised 90 g/l (grams per liter) $Ni(SO_3NH_2)_2$, 6 g/l $NiCl_2$ and 35 g/l $H_3BO_3$, whereas the gold electroplating bath (based on MetGold Pure ATF from Metalor) had a gold content of 13.2 g/l and an antimony content of 20 wt.-ppm (based on MetGold Pure ATF from Metalor).

Thereafter the coated wire precursors were further drawn to final diameters of 20 μm according to the drawing parameters indicated in table 1. All wire samples were finally strand annealed at an oven set temperature of 410° C. for an exposure time of 0.9 seconds, immediately followed by quenching the so-obtained coated wires in water containing 0.07 vol.-% of surfactant. All 20 μm thick wire samples had a 9 nm thick inner layer of nickel and an adjacent outer 90 nm thick layer of gold.

Table 1 gives an overview on the drawing parameters as well as evaluation of the inventive samples S1 to S3 and comparative samples C1 to C5.

TABLE 1

| Wire | Wire drawing speed [m/min] | Cone angle of each drawing die [°] | Bearing length [%] | Circular cross-sectional area reduction of the coated precursor item at each drawing die [%] | Crystallographic orientation of outer layer of gold [%] | | Size of crystal grains of outer gold layer [μm] | Flowery bonded ball | Wire sway |
|---|---|---|---|---|---|---|---|---|---|
| | | | | | <100> | <111> | | | |
| S1 | 600 | 70 | 30 | 9.5 | 90 | 7.4 | 0.19 | +++ | +++ |
| S2 | 600 | 80 | 40 | 9.5 | 91 | 1.0 | 0.26 | +++ | +++ |
| S3 | 600 | 90 | 40 | 9.5 | 82 | 2.0 | 0.17 | +++ | +++ |

TABLE 1-continued

| Wire | Wire drawing speed [m/min] | Cone angle of each drawing die [°] | Bearing length [%] | Circular cross-sectional area reduction of the coated precursor item at each drawing die [%] | Crystallographic orientation of outer layer of gold [%] <100> | Crystallographic orientation of outer layer of gold [%] <111> | Size of crystal grains of outer gold layer [μm] | Flowery bonded ball | Wire sway |
|---|---|---|---|---|---|---|---|---|---|
| C1 | 600 | 60 | 20 | 9.5 | 40 | 30 | 0.39 | ++ | + |
| C2 | 600 | 100 | 50 | 9.5 | 35 | 32 | 0.23 | ++ | +++ |
| C3 | 300 | 80 | 40 | 4.5 | 20 | 35 | 0.42 | +++ | ++ |
| C4 | 900 | 80 | 40 | 9.5 | 35 | 32 | 0.40 | ++ | + |
| C5 | 900 | 60 | 20 | 18.0 | 30 | 25 | 0.41 | + | + |

The invention claimed is:

1. A round wire comprising a wire core with a surface, the wire core having a coating layer superimposed on its surface, wherein the wire core itself is a silver-based wire core, wherein the coating layer is a double-layer comprised of a 1 to 100 nm thick inner layer of palladium or nickel and an adjacent 1 to 250 nm thick outer layer of gold, wherein the outer layer of gold exhibits at least one of the following intrinsic properties A1) and A2):
   A1) the average grain size of the crystal grains in the outer layer of gold, measured in longitudinal direction, is in the range of from 0.1 to 0.8 μm;
   A2) 60 to 100% of the crystal grains in the outer layer of gold are oriented in <100> direction, and 0 to 20% of the crystal grains in the outer layer of gold are oriented in <111> direction, each % with respect to the total number of crystal grains with orientation parallel to the drawing direction of the wire.

2. The round wire of claim 1 having an average diameter is in the range of from 8 to 80 μm.

3. The round wire of claim 1, wherein the silver-based wire core consists of a silver-based material in the form of (a) doped silver, (b) a silver alloy or (c) a doped silver alloy.

4. The round wire of claim 3, wherein the doped silver is a silver-based material consisting of (a1) silver in an amount in the range of from >99.49 to 99.997 wt.-%, (a2) at least one doping element other than silver in a total amount of from 30 to <5000 wt.-ppm and (a3) further components in a total amount of from 0 to 100 wt.-ppm.

5. The round wire of claim 3, wherein the silver alloy is a silver-based material consisting of (b1) silver in an amount in the range of from 89.99 to 99.5 wt.-%, (b2) at least one alloying element in a total amount in the range of from 0.5 to 10 wt.-% and (b3) further components in a total amount of from 0 to 100 wt.-ppm.

6. The round wire of claim 5, wherein the silver alloy comprises palladium as the only alloying element.

7. The round wire of claim 6, wherein the silver alloy has a palladium content of 1 to 2 wt.-%.

8. The round wire of claim 3, wherein the doped silver alloy is a silver-based material consisting of (c1) silver in an amount in the range of from >89.49 to 99.497 wt.-%, (c2) at least one doping element in a total amount of from 30 to <5000 wt.-ppm, (c3) at least one alloying element in a total amount in the range of from 0.5 to 10 wt.-% and (c4) further components in a total amount of from 0 to 100 wt.-ppm, wherein the at least one doping element (c2) is other than the at least one alloying element (c3).

9. The round wire of claim 1, wherein the coating layer superimposed on the surface of the wire core is a double-layer comprised of a 1 to 30 nm thick inner layer of palladium or nickel and an adjacent 1 to 200 nm thick outer layer of gold.

10. The coated round wire of claim 1 exhibiting at least one of the following intrinsic properties A3) to A5):
    A3) the average grain size of the crystal grains in the wire core, measured in longitudinal direction, is in the range of from 0.7 to 1.1 μm;
    A4) the fraction of twin boundaries, measured in longitudinal direction of the wire core, is in the range of from 5 to 40%;
    A5) 20 to 70% of the crystal grains of the wire core are oriented in <100> direction, and 3 to 40% of the crystal grains of the wire core are oriented in <111> direction, each % with respect to the total number of crystal grains with orientation parallel to the drawing direction of the wire.

11. The coated round wire of claim 1, wherein the gold layer comprises at least one member selected from the group consisting of antimony, bismuth, arsenic and tellurium in a total proportion in the range of from 10 to 300 wt.-ppm, based on the weight of the wire.

12. The coated round wire of claim 11, wherein the total proportion of the at least one member selected from the group consisting of antimony, bismuth, arsenic and tellurium is in the range of from 300 to 9500 wt.-ppm, based on the weight of the gold of the gold layer.

13. The coated round wire of claim 11, wherein antimony is alone present within the gold layer.

14. A process for the manufacture of a coated round wire of claims 1, the process comprising at least the steps (1) to (5):
    (1) providing a silver-based precursor item,
    (2) elongating the precursor item to form an elongated precursor item, until an intermediate diameter in the range of from 30 to 200 μm is obtained,
    (3) applying a double-layer coating of an inner layer of palladium or nickel and an adjacent outer layer of gold on the surface of the elongated precursor item obtained after completion of process step (2),
    (4) further elongating the coated precursor item obtained after completion of process step (3) until a desired final diameter and a double-layer comprised of an inner layer of palladium or nickel having a desired final thickness in the range of from 1 to 250 nm is obtained, and
    (5) finally strand annealing the coated precursor obtained after completion of process step (4) at an oven set temperature in the range of from 1 to 250 nm is obtained, and (5) finally strand annealing the coated precursor obtained after completion of process step (4)

at an oven set temperature in the range of from >370 to 520° C. for an exposure time in the range of from 0.8 to 10 seconds to form the coated round wire, wherein step (2) may include one or more sub-steps of intermediate batch annealing of the precursor item at an oven set temperature of from 200 to 650° C. for an exposure time in the range of from 30 to 300 minutes, and wherein the further elongating of step (4) comprises die drawing with the following drawing parameters B1) to B4) prevailing:

B1) the drawing speed is within the range of 500 to 700 meters per minute,

B2) the cone angle of each drawing die is within the range of 70 to 90 degrees,

B3) the bearing length at each drawing die is 30 to 40% of the diameter of the respective circular drawing die opening, B4) the circular cross-sectional area reduction of the coated precursor item at each drawing die is in the range of 7 to 15%.

15. The process of claim 14, wherein the palladium or nickel layer and the gold layer are applied by electroplating.

* * * * *